United States Patent
Chang (12)

(10) Patent No.: US 10,952,001 B2
(45) Date of Patent: Mar. 16, 2021

(54) BIASING CIRCUIT

(71) Applicant: Nuvoton Technology Corporation, Hsinchu (TW)

(72) Inventor: Pao-Shu Chang, Hsinchu (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 16/570,235

(22) Filed: Sep. 13, 2019

(65) Prior Publication Data

US 2020/0100040 A1  Mar. 26, 2020

(30) Foreign Application Priority Data

Sep. 26, 2018 (TW) .................................. 107133795

(51) Int. Cl.
| | | |
|---|---|---|
| *H04R 29/00* | (2006.01) | |
| *H04R 3/00* | (2006.01) | |
| *H03K 3/037* | (2006.01) | |
| *G11C 13/00* | (2006.01) | |

(52) U.S. Cl.
CPC ........... *H04R 29/004* (2013.01); *H03K 3/037* (2013.01); *H04R 3/00* (2013.01); *G11C 13/0021* (2013.01)

(58) Field of Classification Search
CPC ........ H04R 29/004; H04R 3/00; H03K 3/037; G11C 13/0021
USPC .............................. 381/58, 111, 112, 113, 59
See application file for complete search history.

(56) References Cited

U.S. PATENT DOCUMENTS

2011/0142261 A1 * 6/2011 Josefsson ................. H04R 3/00
                                                                 381/107
2020/0204926 A1 * 6/2020 Gabai ....................... H04R 3/10

* cited by examiner

*Primary Examiner* — Ammar T Hamid
(74) *Attorney, Agent, or Firm* — Muncy, Geissler, Olds and Lowe, P.C.

(57) ABSTRACT

A biasing circuit providing power to a microphone is disclosed. The biasing circuit includes a first impedance element, a second impedance element, a detection circuit and a control circuit. The first impedance element has a first impedance and is coupled between a first power node and a first terminal of the microphone. The second impedance element has a second impedance and is coupled between a second terminal of the microphone and a second power node. The detection circuit is coupled between the first and second terminals and generates a detection signal according to an analog signal generated by the microphone. The control circuit adjusts the first and second impedances according to the detection signal.

9 Claims, 6 Drawing Sheets

BIASING CIRCUIT

CROSS-REFERENCE TO RELATED APPLICATION

This application claims the benefit of Taiwan Patent Application No. 107133795, filed on Sep. 26, 2018, in the Taiwan Intellectual Property Office, the disclosure of which is incorporated herein in its entirety by reference.

BACKGROUND OF THE INVENTION

1. Field of the Invention

The present invention relates to a biasing circuit, more particularly to a biasing circuit for providing power to a microphone.

2. Description of the Related Art

A microphone is usually used in the speech and audio band application, to capture energy of speech or audio signal in environment, and convert the energy into a voltage or current. The microphone can be applied to many devices such as a telephone, a recorder, or a hearing aid.

SUMMARY OF THE INVENTION

An objective of the present invention is to provide a biasing circuit with lower consumption.

According an embodiment, the present invention provides a biasing circuit adapted to provide power to a microphone generating an analog signal according to environmental sound, and the biasing circuit includes a first impedance element, a second impedance element, a detection circuit, and a control circuit. The first impedance element has a first impedance and coupled between a first power node and a first terminal of the microphone. The second impedance element has a second impedance and coupled between a second terminal of the microphone and a second power node. The detection circuit is coupled between the first terminal and the second terminal, and configured to generate a detection signal according to the analog signal. The control circuit is configured to adjust the first impedance and the second impedance according to the detection signal.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
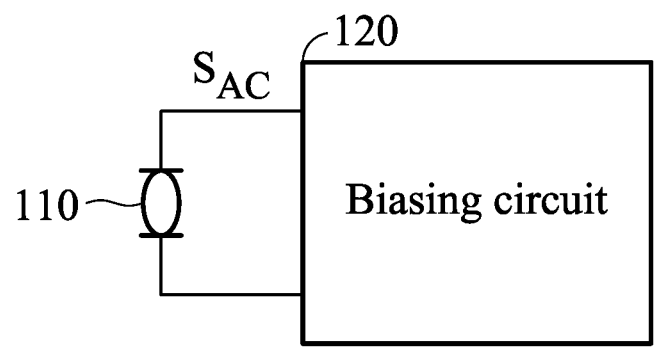
FIG. 1 is a schematic view of an operation circuit of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

FIG. 1 is a schematic view of an operation circuit of the present invention. As shown in FIG. 1, the operation circuit 100 comprises a microphone 110 and a biasing circuit 120. The microphone 110 is configured to detect acoustic wave in ambient environment, and generate an analog signal $S_{AC}$ according to a detection result. The type of the microphone 110 used in the present invention is not limited; in an embodiment, the microphone 110 can be a condenser microphone. In other embodiment, the microphone 110 can generate a digital signal according to acoustic wave in ambient environment.

The biasing circuit 120 can provide power to the microphone 110 according to the analog signal $S_{AC}$. In an embodiment, when the microphone 110 detects acoustic wave, the biasing circuit 120 can be operated in a normal mode. In the normal mode, the biasing circuit 120 can provide a first current to the microphone 110. When the microphone 110 detects absence of acoustic wave, the biasing circuit 120 enters a standby mode. In the standby mode, the biasing circuit 120 provides a second current to the microphone 110. In this embodiment, the second current is lower than the first current, and when the current flowing through the microphone 110 becomes lower, the power consumption of the microphone 110 can be reduced. Furthermore, in the standby mode, the biasing circuit 120 can provide current to the microphone 110, so the microphone 110 still has the detection capability. When the microphone 110 detects acoustic wave, the microphone 110 can quickly generate the analog signal $S_{AC}$ to wake up the biasing circuit 120, to enable the biasing circuit 120 to leave the standby mode and rapidly enter the normal mode. In the normal mode, the biasing circuit 120 can provide a larger current to the microphone 110, so the microphone 110 can accurately detect acoustic wave in environment, and the acoustic wave can be recognized accurately. In an embodiment, the first current can be higher than 100 uA and the second current can be lower than 100 uA.

Figure 2:
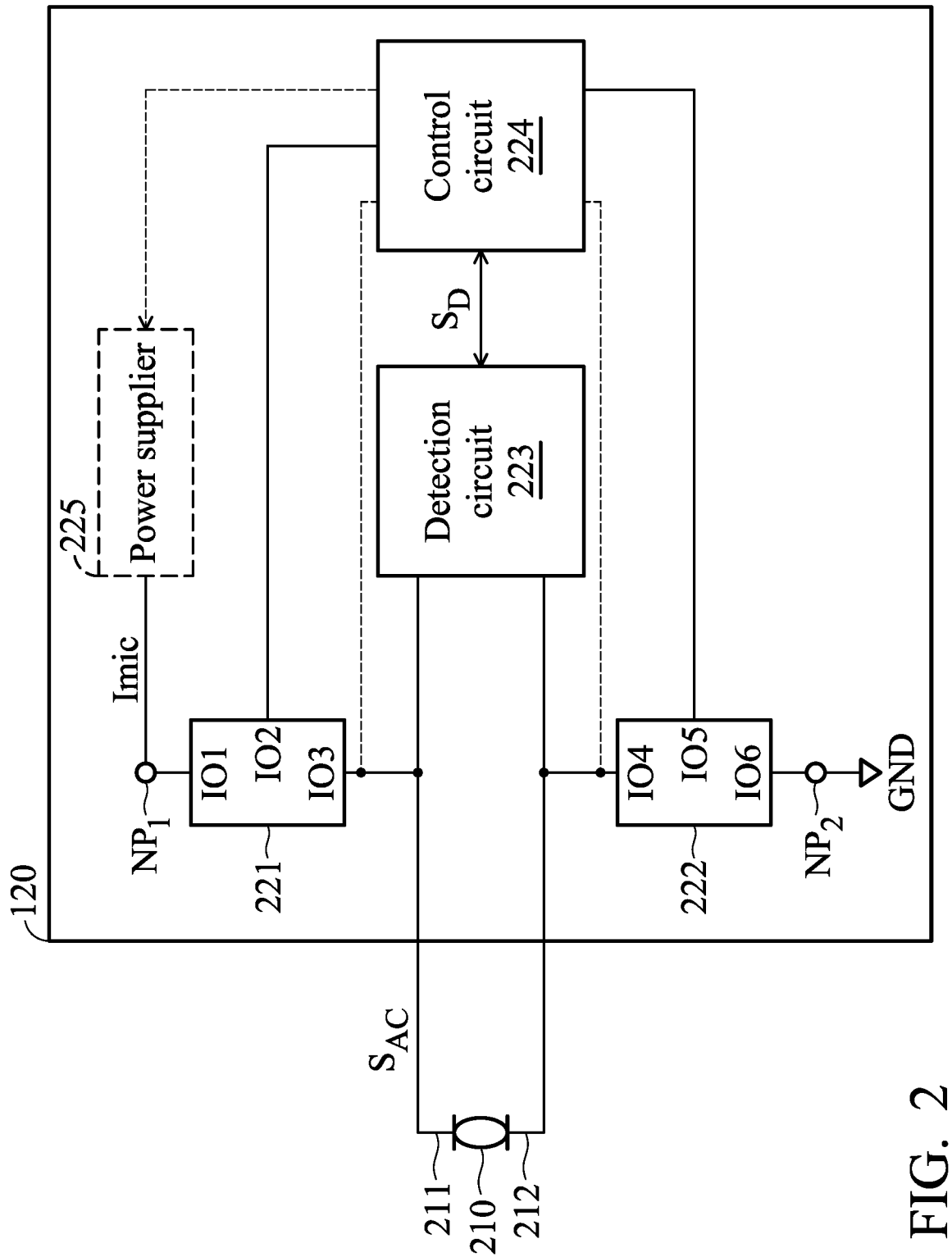
FIG. 2 is a schematic view of a biasing circuit of the present invention.

FIG. 2 is a schematic view of a biasing circuit of the present invention. As shown in FIG. 2, the biasing circuit 120 comprises impedance elements 221 and 222, a detection circuit 223 and a control circuit 224. The impedance elements 221 and 222 and the microphone 210 are electrically connected in series between power nodes $NP_1$ and $NP_2$. The power node $NP_1$ can receive a first operating voltage and the power node $NP_2$ can receive a second operating voltage such as a ground voltage GND. In this embodiment, the second operating voltage is lower than the first operating voltage.

The impedance element 221 has input/output (abbreviated as I/O hereafter) pins IO1 to IO3. The I/O pin IO1 is coupled to the power node $NP_1$. The I/O pin IO2 is coupled to the control circuit 224. The I/O pin IO3 coupled to a first terminal 211 of the microphone 210. In this embodiment, the impedance of the impedance element 221 depends on a voltage level of at least one of the I/O pins IO1 to IO3. For example, when the voltage level of at least one of the I/O pins IO1 to IO3 is changed, the impedance of the impedance element 221 is also changed.

The impedance element 222 has I/O pins IO4 to IO6. The I/O pin IO4 is coupled to a second terminal 212 of the microphone 110. The I/O pin IO5 is coupled to the control circuit 224. The I/O pin IO6 is coupled to the power node $NP_2$. In this embodiment, the impedance of the impedance element 222 depends on a voltage level of at least one of the I/O pins IO4 to IO6. For example, when the voltage level of at least one of the I/O pins IO4 to IO6 is changed, the impedance of the impedance element 222 is also changed.

The types of the impedance elements 221 and 222 used in the present invention are not limited. In an embodiment, the impedance elements 221 and 222 can be variable resistors. In another embodiment, the impedance elements 221 and 222 can be resistive random-access memory (RRAM) cells. For example, the impedance element 221 can be a specific resistive memory cell coupled to a word line, a bit line and a source line. In this example, the first I/O pin among the I/O pins IO1 to IO3 is coupled to the word line, the second I/O pin among the I/O pins IO1 to IO3 is coupled to the bit line, and the third I/O pin among the I/O pins IO1 to IO3 is coupled to the source line.

In an embodiment, the impedance element 221 can perform a reset operation according to the voltage levels of the I/O pins IO1 to IO3. After the reset operation, the resistance state of the impedance element 221 is at a high resistance state (HRS). In another embodiment, the impedance element 221 can perform a setting operation according to the voltage levels of the I/O pins IO1 to IO3. After the setting operation, the resistance state of the impedance element 221 is at a low resistance state (LRS).

In a normal mode, the impedance of the impedance element 221 is a first preset value and the impedance of the impedance element 222 is a second preset value. In a standby mode, the impedance of the impedance element 221 is a third preset value and the impedance of the impedance element 222 is a fourth preset value. In an embodiment, the first preset value is equal to the second preset value, and the third preset value is equal to the fourth preset value, but the present invention is not limited thereto. In other embodiment, the first preset value is not equal to the second preset value, and the third preset value is not equal to the fourth preset value. In an embodiment, each of the first preset value and the second preset value is about 2.2KΩ, each of the third preset value and the fourth preset value can be in a range of 20KΩ to 100KΩ; however, the present invention is not limited to the above-mentioned values of the first to fourth preset values; the first to fourth preset values can be any values as long as the detection circuit 223 can effectively detect acoustic wave in the normal mode, and the microphone in the standby mode can have power consumption low enough to meet the designer's requirement.

The detection circuit 223 is coupled to the first terminal 211 and the second terminal 212, and configured to generate a detection signal $S_D$ according to the analog signal $S_{AC}$. In this embodiment, the detection circuit 223 can determine whether the analog signal $S_{AC}$ matches a preset condition. When the analog signal $S_{AC}$ does not match the preset condition, it indicates that the microphone 210 detects absence of acoustic wave or the acoustic wave in environment is too weak; in this case, the detection circuit 223 can control the control circuit 224, by using the detection signal $S_D$, to leave the normal mode and enter the sleep mode. At this time, the detection signal $S_D$ serves as a sleep notice.

When the analog signal $S_{AC}$ matches the preset condition, it indicates the microphone 210 detects acoustic wave, so the detection circuit 223 can wake up the control circuit 224, by using the detection signal $S_D$, to enable the control circuit 224 to leave the sleep mode and enter the normal mode. At this time, the detection signal $S_D$ serves as a wake-up notice. When the control circuit 224 is operated in the normal mode, the control circuit 224 can perform a voice recognition operation to recognize acoustic wave in ambient environment.

In an embodiment, the preset condition means that a number of times of the analog signal $S_{AC}$ being higher than a preset voltage level reaches a target value. In this example, the detection circuit 223 can compare the analog signal $S_{AC}$ and a preset voltage level. When the number of times of the analog signal $S_{AC}$ being higher than the preset voltage level is smaller than a target value, it indicates that the analog signal $S_{AC}$ does not match the preset condition, and in this case, the detection signal $S_D$ generated by the detection circuit 223 serves as the sleep notice. When the number of times of the analog signal $S_{AC}$ being higher than the preset voltage level reaches the target value, it indicates that the analog signal $S_{AC}$ matches the preset condition, and in this case, the detection signal $S_D$ generated by the detection circuit 223 serves as the wake-up notice.

The control circuit 224 adjusts the impedance of the impedance elements 221 and 222 according to the detection signal $S_D$. For example, when the detection signal $S_D$ is the sleep notice, it indicates that the microphone 210 detects absence of acoustic wave, so the control circuit 224 enters the standby mode. In the standby mode, the control circuit 224 increases the impedance of the impedance elements 221 and 222. When the detection signal $S_D$ is the wake-up notice, it indicates that the microphone 210 detects acoustic wave, so the control circuit 224 enters the normal mode, and in this case, the control circuit 224 decreases the impedance of the impedance elements 221 and 222.

The way that the control circuit 224 adjusts the impedance of the impedance elements 221 and 222 is not limited in the present invention. In an embodiment, the control circuit 224 can change voltage level of at least one of I/O pins IO1 to IO3, to control the impedance of the impedance element 221. Similarly, the control circuit 224 can change voltage level of at least one of I/O pins IO4 to IO6, to control the impedance of the impedance element 222.

In other embodiment, the biasing circuit 120 comprises a power supplier 225. The power supplier 225 is coupled to the power node $NP_1$ and configured to provide an output current Imic. When the control circuit 224 enters the normal mode from the standby mode, the control circuit 224 can control the power supplier 225 to increase the output current Imic. When the control circuit 224 enters the standby mode, the control circuit 224 can control the power supplier 225 to decrease the output current Imic. The power supplier 225 does not need to continuously provide a larger current, so the power supplier 225 can have lower power consumption. In an embodiment, the output current Imic in the normal mode is about 170 uA, and the output current Imic in the standby mode is lower than 100 uA; however, the value of the output current Imic in the present invention is not limited to above-mentioned example. The output current Imic can be any value as long as the detection circuit 223 can effectively detect acoustic wave in the normal mode and the microphone 210 in the standby mode can have power consumption low enough to meet requirement. Furthermore, the present invention is not limited to the circuit architecture of the power supplier 225. In an embodiment, the power supplier 225 can be a regulator, such as low-power LDO.

Figure 3:
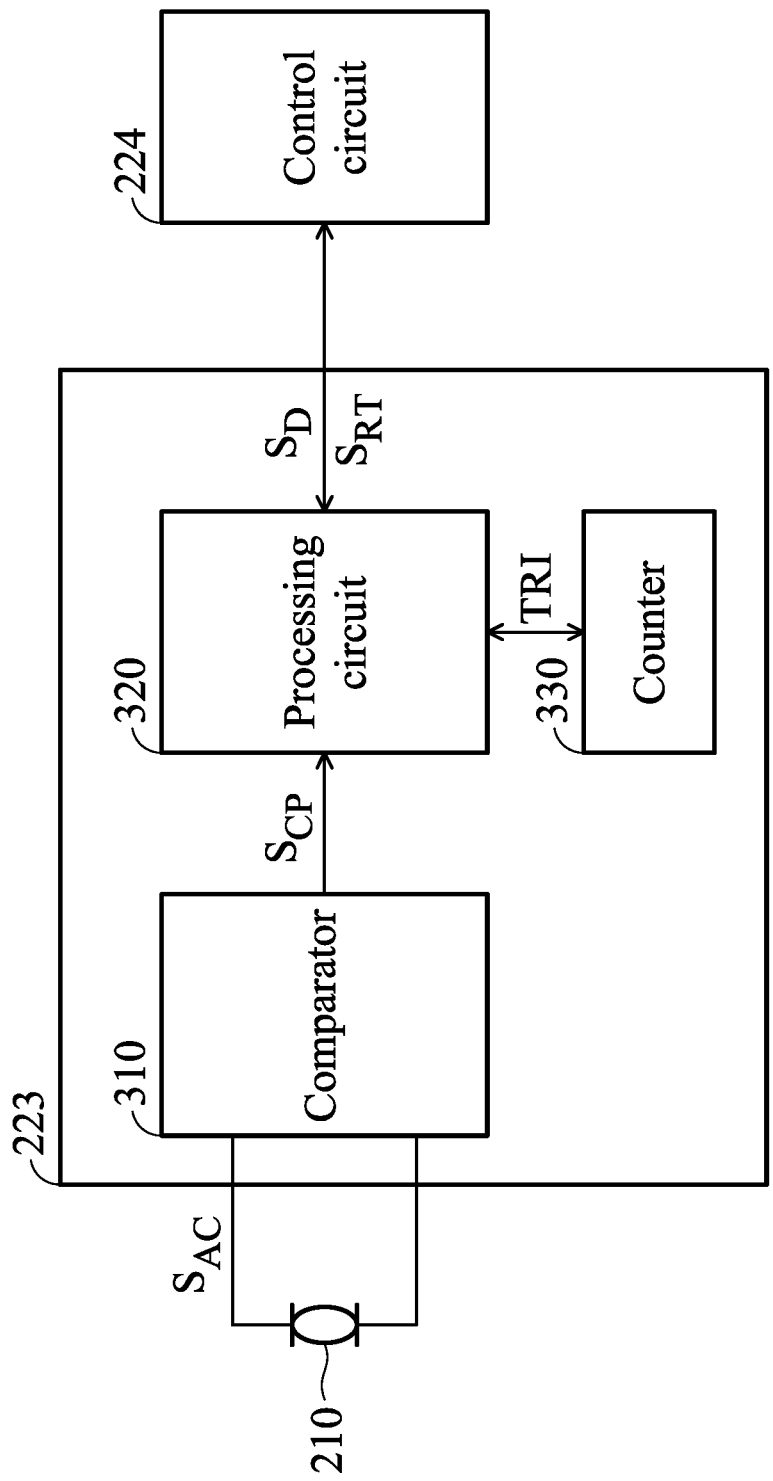
FIG. 3 is a schematic view of a detection circuit of the present invention.
Figure 4:
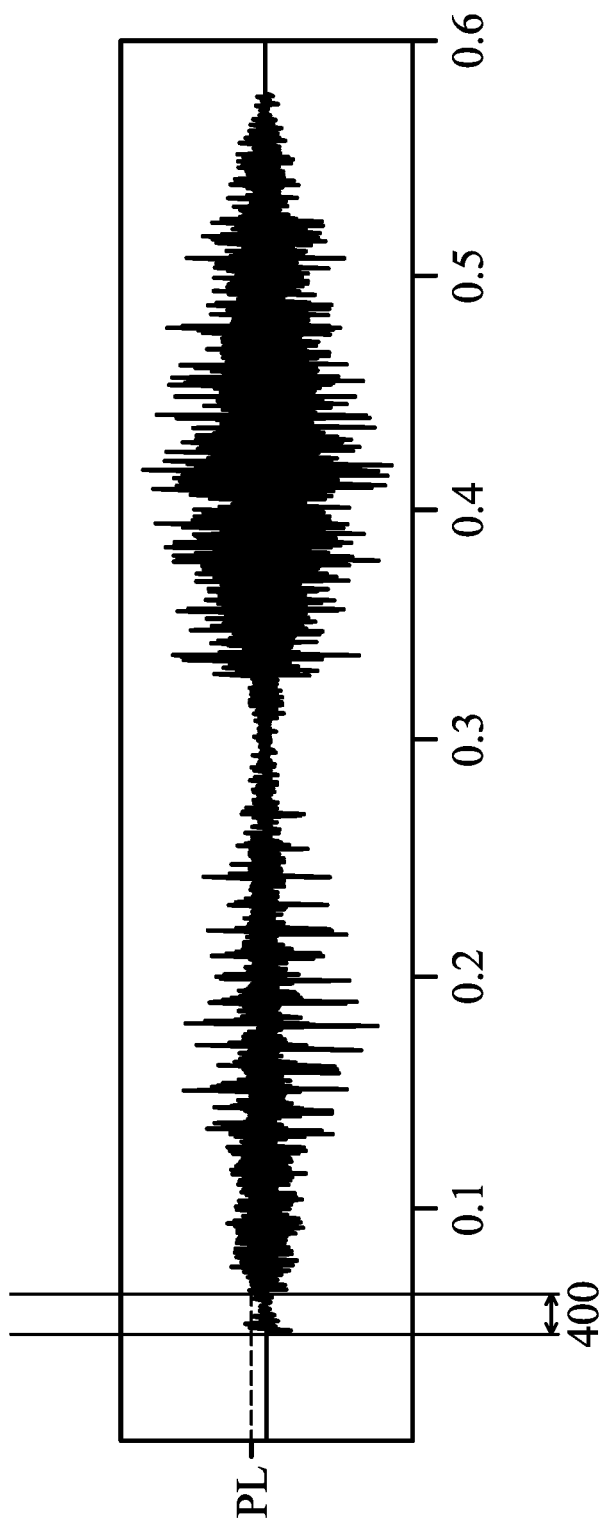
FIG. 4 is a schematic view of an analog signal of the present invention.

FIG. 3 is a schematic view of a detection circuit of the present invention. In this embodiment, the detection circuit 223 can comprise a comparator 310, a processing circuit 320 and a counter 330. The comparator 310 receives the analog signal $S_{AC}$, and configured to compare the analog signal $S_{AC}$ with a preset voltage level, so as to generate a comparison result $S_{CP}$. FIG. 4 is a schematic view an analog signal $S_{AC}$. As shown in FIG. 4, the analog signal $S_{AC}$ can be an AC signal. In a preset period 400, the comparator 310 compares the analog signal $S_{AC}$ with the preset voltage level PL, so as to generate the comparison result $S_{CP}$. In an embodiment, the preset period 400 is about 50 µs.

In FIG. 3, the processing circuit 320 can determine, according to the comparison result $S_{CP}$, whether the analog signal $S_{AC}$ is higher than the preset voltage level PL, and record the number of times of the analog signal $S_{AC}$ being higher than the preset voltage level PL. In an embodiment, when the analog signal $S_{AC}$ is higher than the preset voltage level PL, the processing circuit 320 can generate and output a trigger signal TRI to the counter 330, so as to adjust a counting value CT of the counter 330. In an embodiment, the counting value CT is increased or decreased gradually.

After the processing circuit 320 reads the counting value CT, the processing circuit 320 can determine whether the number of times of the analog signal $S_{AC}$ being higher than the preset voltage level PL is equal to the target value. When the counting value CT reaches the target value, it indicates that the analog signal $S_{AC}$ matches the preset condition, so the processing circuit 320 can generate the detection signal $S_D$ to control the control circuit 224 to enter the normal mode. When the counting value CT does not reach the target value, it indicates that the analog signal $S_{AC}$ does not match the preset condition, so the processing circuit 320 controls the control circuit 224, by using the detection signal $S_D$, to enter the standby mode.

In other embodiment, after the control circuit 224 enters the normal mode, the control circuit 224 outputs the reset signal $S_{RT}$, and the processing circuit 320 can reset the counter 330 according to the reset signal $S_{RT}$, so that the counting value CT of the counter 330 is equal to an initial value. Furthermore, in the normal mode, the control circuit 224 can directly receive the analog signal $S_{AC}$ and then recognize a speech message indicated by the analog signal $S_{AC}$. In this example, the control circuit 224 can include a AC-DC convertor for converting the analog signal $S_{AC}$ into a digital signal.

Figure 5:
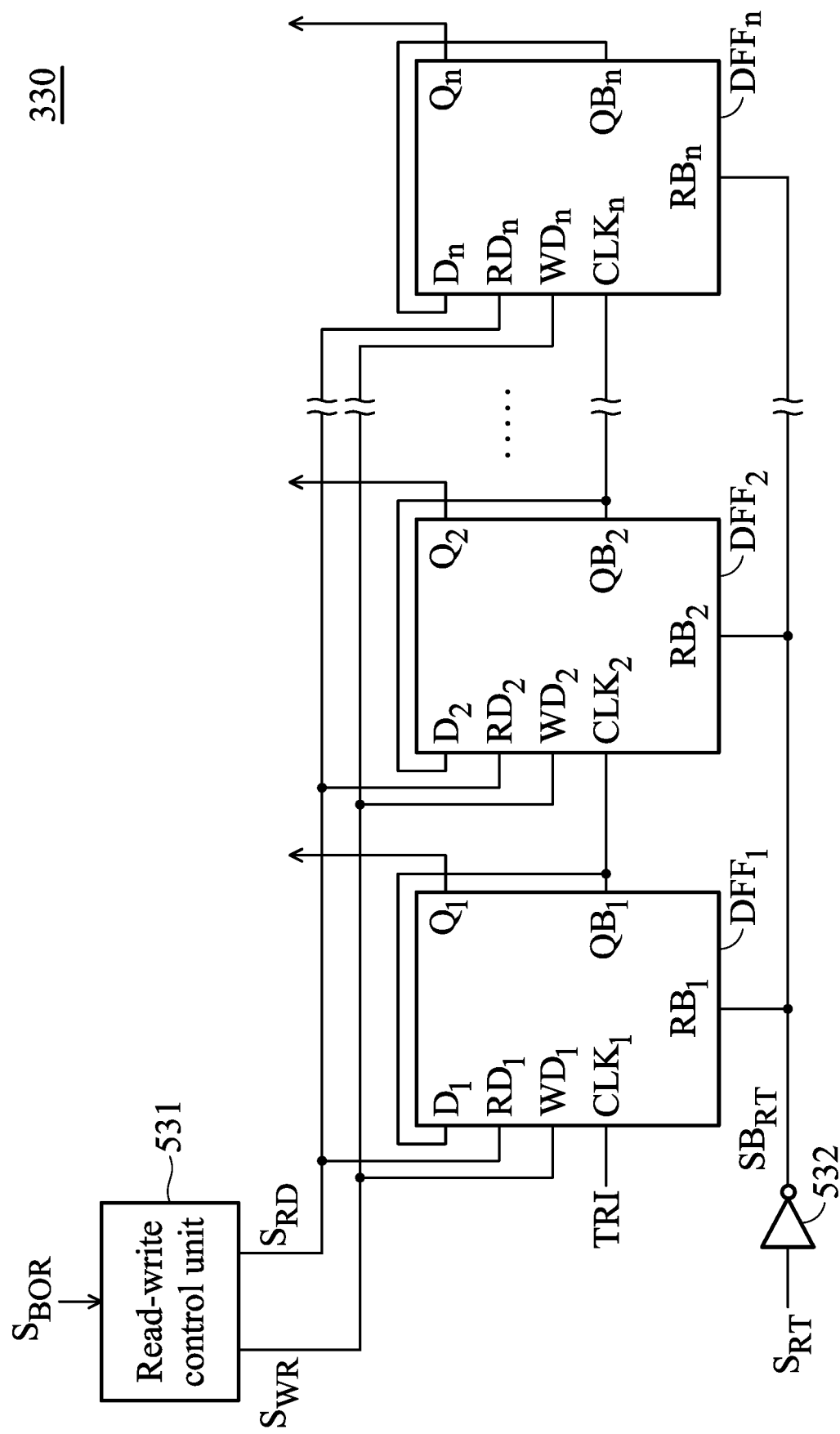
FIG. 5 is a schematic view of a counter of the present invention.

FIG. 5 is a schematic view of the counter 330 of the present invention. In this embodiment, the counter 330 can comprise non-volatile D-Flip-Flops $DFF_1$ to $DFF_n$ electrically connected in series together. The operations of the non-volatile D-Flip-Flops $DFF_1$ to $DFF_n$ are the same, so the non-volatile D-Flip-Flops $DFF_1$ and $DFF_2$ are taken as example for illustrating an operation of the counter 330.

The non-volatile D-Flip-Flop $DFF_1$ has a clock terminal $CLK_1$, an input terminal $D_1$, an output terminal $Q_1$, an inverting output terminal $QB_1$ and a non-volatile memory element (not shown in FIG. 5). The clock terminal $CLK_1$ can receive the trigger signal TRI. The inverting output terminal $QB_1$ is electrically connected to the input terminal $D_1$.

The non-volatile D-Flip-Flop $DFF_2$ has a clock terminal $CLK_2$, an input terminal $D_2$, an output terminal $Q_2$, an inverting output terminal $QB_2$ and a non-volatile memory element (not shown in FIG. 5). The clock terminal $CLK_2$ is electrically connected to the inverting output terminal $QB_1$. The inverting output terminal $QB_2$ is electrically connected to the input terminal $D_2$ and the clock terminal of the next non-volatile D-Flip-Flop. In this embodiment, the non-volatile D-Flip-Flops $DFF_1$ and $DFF_2$ have the same circuit architectures.

When a voltage level of a clock terminal of a specific non-volatile D-Flip-Flop is changed from a first voltage level (such as a low logic level) to a second voltage level (such as a high logic level), the specific non-volatile D-Flip-Flop starts operating. For example, when the trigger signal TRI is changed from the low logic level to the high logic level, the non-volatile D-Flip-Flop $DFF_1$ starts operating, and at this time, the inverting output terminal $QB_1$ outputs a first logic signal which can be at a logic state "0" or a logic state "1". The input terminal $D_1$ and the clock terminal $CLK_2$ can receive the first logic signal. In this embodiment, the logic state of the output terminal of each non-volatile D-Flip-Flop depends on the logic state of the logic signal received by the input terminal of each non-volatile D-Flip-Flop. In an embodiment, the logic state of the output terminal of a non-volatile D-Flip-Flop is the same as the logic state of the input terminal, and the logic state of the inverting output terminal of the non-volatile D-Flip-Flop is reverse to the logic state of the output terminal. Furthermore, the logic state stored in the non-volatile memory element of the non-volatile D-Flip-Flop is changed correspondingly to the logic state of the output terminal of the non-volatile D-Flip-Flop. For example, in the non-volatile D-Flip-Flop $DFF_1$, the logic state of the first logic signal outputted by the inverting output terminal $QB_1$ is reverse to the logic state of the input terminal $D_1$ and the output terminal $Q_1$. When the first logic signal is transmitted to the input terminal $D_1$, the logic state of the input terminal $D_1$ and the output terminal $Q_1$ are changed, for example, from the logic state "0" to the logic state "1", or from the logic state "1" to logic state "0". At this time, the non-volatile memory element of the non-volatile D-Flip-Flop $DFF_1$ can store the logic state of the output terminal $Q_1$.

Furthermore, in greater detail, the non-volatile memory element of the non-volatile D-Flip-Flop is used to store a logic state, but not accumulate the stored logic state, and the logic state stored in the non-volatile memory element of the non-volatile D-Flip-Flop is changed correspondingly to the logic state of the output terminal of the non-volatile D-Flip-Flop. In other words, the non-volatile memory element of the non-volatile D-Flip-Flop stores the logic state "0" or the logic state "1". Because of the characteristic of the non-volatile memory element of the non-volatile D-Flip-Flop, the logic state of the output terminal of the non-volatile D-Flip-Flop is at an initial state during power off, but the non-volatile memory element of the non-volatile D-Flip-Flop still keeps the final logic state before power off. After the non-volatile D-Flip-Flop is powered on again, the non-volatile memory element of the non-volatile D-Flip-Flop sets the logic state of the output terminal of the non-volatile D-Flip-Flop according to the stored logic state. Therefore, according to the logic state of the output terminal of the non-volatile D-Flip-Flop, the logic state (such as logic state "0" or logic state "1") stored in the non-volatile memory element of the non-volatile D-Flip-Flop can be determined.

For example, under a condition that the first logic signal outputted from the inverting output terminal $QB_1$ is the logic state "1", when the input terminal $D_1$ receives the first logic signal, the logic state of the input terminal $D_1$ is changed to logic state "1" from logic state "0" and the logic state of the output terminal $Q_1$ is also changed to logic state "1" from logic state "0". As a result, the logic state stored in the non-volatile memory element of the non-volatile D-Flip-Flop $DFF_1$ is logic state "1". On the contrary, under a condition that the first logic signal outputted from the inverting output terminal $QB_1$ is logic state "0", when the input terminal $D_1$ receives the first logic signal, the logic states of the input terminal $D_1$ and the output terminal $Q_1$ are logic state "0", and the logic state stored in the non-volatile memory element of the non-volatile D-Flip-Flop $DFF_1$ is logic state "0".

In an embodiment, every time the processing circuit 320 generates the trigger signal TRI, the logic state of the output terminal $Q_1$ of the non-volatile D-Flip-Flop $DFF_1$ is changed in response to the trigger signal TRI. The non-volatile D-Flip-Flop $DFF_2$ receives the first logic signal outputted from the inverting output terminal $QB_1$, and the non-volatile D-Flip-Flop $DFF_2$ performs aforementioned operation only when the first logic signal is changed to the high logic level from the low logic level. In an embodiment, the first logic signal outputted from the inverting output terminal $QB_1$ is alternatively changed between the low logic level and the high logic level, and the second logic signal outputted from output terminal $Q_2$ has a cycle which is two times of a cycle of the first logic signal outputted from the output terminal $Q_1$. Table one shows a relationship between the changes of the logic states of the output terminal $Q_1$ and the inverting output terminal $QB_1$ of the non-volatile D-Flip-Flop $DFF_1$, the logic states of the output terminal $Q_2$ and the inverting output terminal $QB_2$ of the non-volatile D-Flip-Flop $DFF_2$ and the generation times of the voltage signal.

TABLE ONE

| Generation times of the voltage signal | Initial state | First time | Second time | Third time |
|---|---|---|---|---|
| $Q_1$ | 0 | 1 | 0 | 1 |
| $QB_1$ | 1 | 0 | 1 | 0 |
| $Q_2$ | 0 | 0 | 1 | 1 |
| $QB_2$ | 1 | 1 | 0 | 0 |

The logic state of the output terminal $Q_1$ and the logic state of the output terminal $Q_2$ can form a piece of counting data, and the logic state of the output terminal $Q_1$ and the logic state of the output terminal $Q_2$ can indicate values of different bits of the counting data, respectively. In greater detail, the logic state of the output terminal $Q_1$ and the logic state of the output terminal $Q_2$ indicate the values of different bits of binary value, respectively. In an embodiment, the logic state of the output terminal $Q_1$ indicates the value of a first bit of the binary value, and the logic state of the output terminal $Q_2$ indicates the value of a second bit of the binary value. For example, as shown in the table one, when the second voltage signal is generated, the counting data stored in the counter 330 is "10", and the value of the first bit (that is, the least significant bit) of the counting data is logic state "0" of the output terminal $Q_1$, and the value of the second bit (that is, the most significant bit) is the logic state "1" of the output terminal $Q_2$.

In above embodiment, the non-volatile D-Flip-Flops $DFF_1$ and $DFF_2$ are taken as example for illustrating the operation of the counter 330. In a condition that the counter 330 comprises two non-volatile D-Flip-Flops, the maximal counting value can be $(2^2-1)$. Furthermore, when the counter 330 is formed by electrically connecting n non-volatile D-Flip-Flops in a sequential order, the maximal counting value can be $(2^n-1)$. For example, when the counter 330 includes three non-volatile D-Flip-Flops electrically connected in a sequential order, the logic states of the output terminals and the inverting output terminals of all non-volatile D-Flip-Flops are shown in a table two below. The cycle of the logic signal outputted from the output terminal $Q_3$ is two times of that of the second logic signal outputted from the output terminal $Q_2$, and four times of that of the first logic signal outputted from the output terminal $Q_1$. When the counter 330 includes three non-volatile D-Flip-Flops electrically connected in a sequential order, the maximal counting value is 7, which is $(2^3-1)$.

TABLE TWO

| times | 0 | 1 | 2 | 3 | 4 | 5 | 6 | 7 | 8 |
|---|---|---|---|---|---|---|---|---|---|
| $Q_1$ | 0 | 1 | 0 | 1 | 0 | 1 | 0 | 1 | 0 |
| $QB_1$ | 1 | 0 | 1 | 0 | 1 | 0 | 1 | 0 | 1 |
| $Q_2$ | 0 | 0 | 1 | 1 | 0 | 0 | 1 | 1 | 0 |
| $QB_2$ | 1 | 1 | 0 | 0 | 1 | 1 | 0 | 0 | 1 |
| $Q_3$ | 0 | 0 | 0 | 0 | 1 | 1 | 1 | 1 | 0 |
| $QB_3$ | 1 | 1 | 1 | 1 | 0 | 0 | 0 | 0 | 1 |

According to different counting requirements, different numbers of the non-volatile D-Flip-Flops can be disposed in the counter 330. For example, when the counter 330 includes 20 non-volatile D-Flip-Flops, the maximal counting value can reach 1048575 ($2^{20}-1$).

For example, the non-volatile memory element of the non-volatile D-Flip-Flop $DFF_1$ stores the logic state of the output terminal Q1 of the non-volatile D-Flip-Flop $DFF_1$, and the non-volatile memory element of other non-volatile D-Flip-Flop $DFF_2$ stores the logic state of the output terminal $Q_2$ of the non-volatile D-Flip-Flop $DFF_2$, and so on; as a result, in order to obtain the counting value CT of the counter 330, the processing circuit 320 can read, in the sequential order, the logic state stored in the non-volatile memory elements of the non-volatile D-Flip-Flops. Next, the processing circuit 320 combines the read logic states as a binary value, and then converts the binary value into a decimal counting value CT.

According to above-mentioned content, when the analog signal $S_{AC}$ is higher than a preset voltage level, the processing circuit 320 can generate the trigger signal TRI, and the non-volatile D-Flip-Flops $DFF_1$ to $DFF_n$ in the counter 330 can operate in response to the trigger signal TRI. The logic states of the output terminals are stored in the non-volatile memory elements of the non-volatile D-Flip-Flops $DFF_1$ to $DFF_n$, so the processing circuit 320 can read and convert the logic states into the decimal counting value. The counter 330 can record the number of times of the analog signal $S_{AC}$ being higher than the preset voltage level, so as to perform the counting function.

In other embodiment, the counter 330 comprises a read-write control unit 531. In this example, each of the non-volatile D-Flip-Flops $DFF_1$ to $DFF_n$ has a read terminal and a write terminal. For example, the non-volatile D-Flip-Flop $DFF_1$ has a read terminal $RD_1$ and a write terminal $WD_1$. The non-volatile D-Flip-Flop $DFF_2$ has a read terminal $RD_2$ and a write terminal $WD_2$.

The read-write control unit 531 can generate a read signal $S_{RD}$ and a write signal $S_{WR}$ according to an input signal $S_{BOR}$. In an embodiment, the input signal $S_{BOR}$ is generated by a brown-out reset circuit. The brown-out reset circuit can be disposed in the processing circuit 320 or counter 330. In other embodiment, the brown-out reset circuit can be independent from the processing circuit 320 and counter 330. In an embodiment, the brown-out reset circuit can be integrated in the control circuit 224.

In this embodiment, the read terminal of each of the non-volatile D-Flip-Flops $DFF_1$ to $DFF_n$ receives the read signal $S_{RD}$. The write terminal of each of the non-volatile D-Flip-Flops $DFF_1$ to $DFF_n$ receives the write signal $S_{WR}$. For example, in the non-volatile D-Flip-Flops $DFF_1$ and $DFF_2$, when the read terminals $RD_1$ and $RD_2$ receive the read signal $S_{RD}$, the non-volatile memory element of the non-volatile D-Flip-Flop $DFF_1$ output the stored logic state thereof to the output terminal $Q_1$, and the non-volatile memory element of the non-volatile D-Flip-Flop $DFF_2$ outputs the stored logic state thereof to the output terminal $Q_2$. At this time, the logic state of the output terminal $Q_1$ is the same as the logic state stored in the non-volatile memory element of the non-volatile D-Flip-Flop $DFF_1$, and the logic state of the output terminal $Q_2$ is the same as the logic state stored in the non-volatile memory element of the non-volatile D-Flip-Flop $DFF_2$. When the write terminals $WD_1$ and $WD_2$ receive the write signal $S_{WR}$, the non-volatile memory element of the non-volatile D-Flip-Flop $DFF_1$ stores the logic state of the output terminal $Q_1$, and the non-volatile memory element of the non-volatile D-Flip-Flop $DFF_2$ stores the logic state of the output terminal $Q_2$.

In greater detail, when the processing circuit 320 transmits the trigger signal TRI to the non-volatile D-Flip-Flop $DFF_1$, the BOR circuit (not shown in figure) transmits an input signal $S_{BOR}$ to the read-write control unit 531. The read-write control unit 531 generates and transmits the read signal $S_{RD}$ to the read terminals $RD_1$ and $RD_2$ according to the input signal $S_{BOR}$, so as to set the logic state of the output terminal $Q_1$ the same as the logic state stored in the non-volatile memory element of the non-volatile D-Flip-Flop $DFF_1$, and set the logic state of the output terminal $Q_2$ the same as the logic state stored in the non-volatile memory element of the non-volatile D-Flip-Flop $DFF_2$. In this case, the non-volatile D-Flip-Flops $DFF_1$ and $DFF_2$ operate according to the trigger signal TRI. Next, when the trigger signal TRI is ended, the read-write control unit 531 generates and transmits the write signal $S_{WR}$ to the write terminals $WD_1$ and $WD_2$ according to the input signal $S_{BOR}$, so that the logic state of the output terminal $Q_1$ can be stored in the non-volatile memory element of the non-volatile D-Flip-Flop $DFF_1$ and the logic state of the output terminal $Q_2$ can be stored in the non-volatile memory element of the non-volatile D-Flip-Flop $DFF_2$. When the processing circuit 320 provides the trigger signal TRI again, the non-volatile memory element of the non-volatile D-Flip-Flops $DFF_1$ and $DFF_2$ outputs the previously-stored logic state to the output terminal $Q_1$ and $Q_2$, respectively. Every time the counter 330 receives the trigger signal TRI to perform the counting operation, the non-volatile memory element of each of the non-volatile D-Flip-Flops $DFF_1$ to $DFF_n$ of the counter 330 performs the read-write operation once, thereby ensuring accumulation of the counting data.

Furthermore, in order to read the counting value CT, the processing circuit 320 can provide the read signal to the read terminals of the non-volatile D-Flip-Flops $DFF_1$ to $DFF_n$, to control the non-volatile memory elements of the non-volatile D-Flip-Flops $DFF_1$ to $DFF_n$ to output the stored logic states to the output terminals $Q_1$ to $Q_n$. In this example, according to the logic states of the output terminals $Q_1$ to $Q_n$ of the non-volatile D-Flip-Flops $DFF_1$ to $DFF_n$, the processing circuit 320 can obtain the logic states stored in the non-volatile memory elements of the non-volatile D-Flip-Flops $DFF_1$ to $DFF_n$. Next, the processing circuit 320 can convert the logic states stored in the non-volatile memory elements of the non-volatile D-Flip-Flops $DFF_1$ to $DFF_n$, so as to obtain the counting value CT.

In other embodiment, each of the non-volatile D-Flip-Flops $DFF_1$ to $DFF_n$ has a reset terminal for receiving a reset signal $SB_{RT}$. The reset signal $SB_{RT}$ is used to initialize the non-volatile memory elements of the non-volatile D-Flip-Flops $DFF_1$ to $DFF_n$. In this example, after initialization, the non-volatile memory element of each of the non-volatile D-Flip-Flops $DFF_1$ to $DFF_n$ stores a preset value, such as logic state "0". In this embodiment, the counter 330 can comprise a NOT gate 532. The NOT gate 532 can invert a reset signal $S_{RT}$, to generate a reset signal $SB_{RT}$. In an embodiment, the reset signal $S_{RT}$ is generated by the control circuit 224.

Furthermore, in order to read the counting value CT stored in the counter 330, the control circuit 224 can output at least one control signal to the processing circuit 320, to control the processing circuit 320 to read the counting value CT of the counter 330 by aforementioned manner. The processing circuit 320 then transmits the counting value CT to the control circuit 224. In order to reset the counter 330 for setting the counting value CT as a preset value, such as 0, the control circuit 224 can output at least one control signal (such as the reset signal $S_{RT}$) to control the processing circuit 320 to reset the counter 330 by above-mentioned manner.

Figure 6:
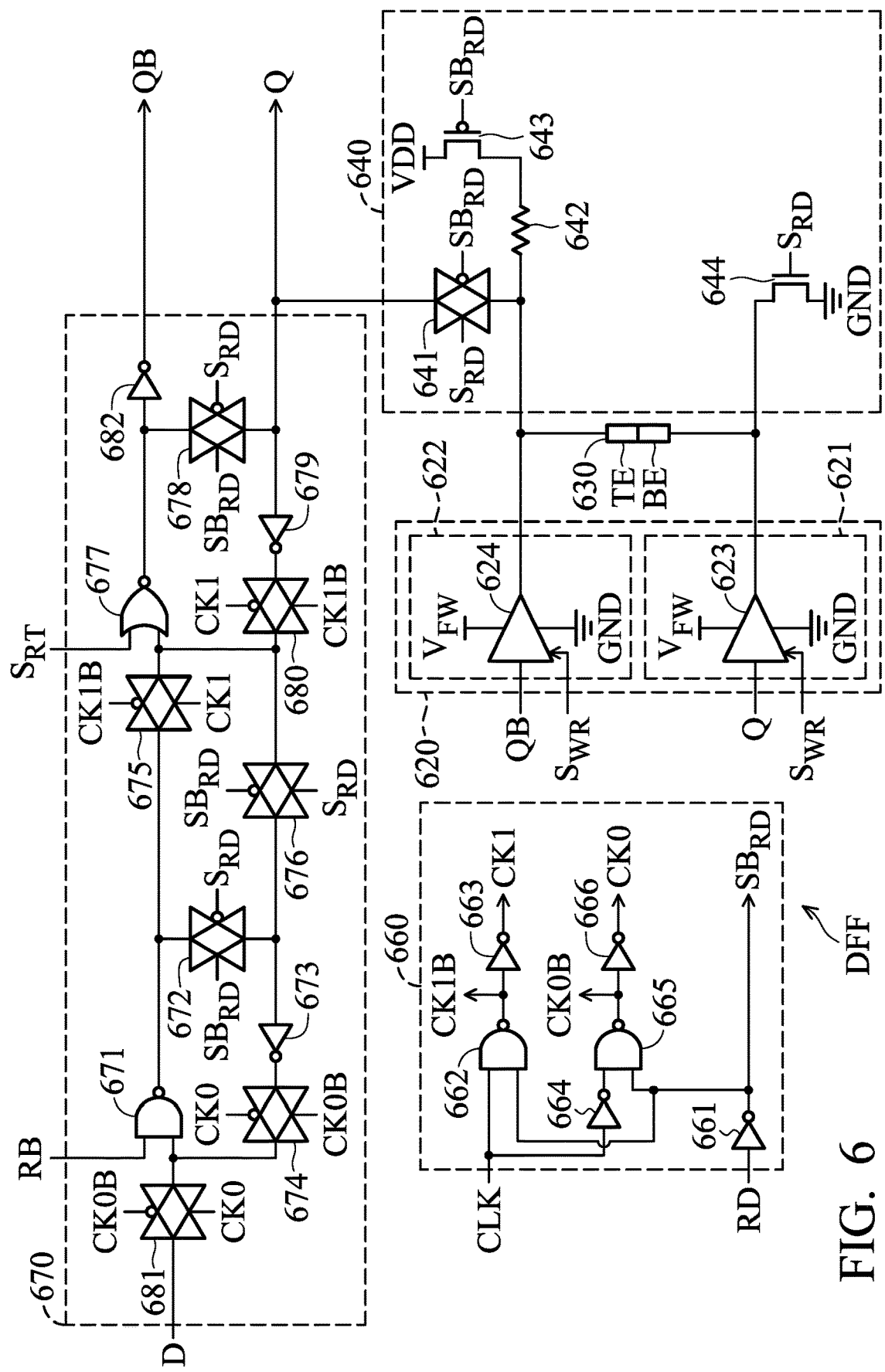
FIG. 6 is a schematic view of an embodiment of a non-volatile D-Flip-Flop of the present invention.

FIG. 6 is a schematic view of an embodiment of a non-volatile D-Flip-Flop of the present invention. As shown in FIG. 6, the non-volatile D-Flip-Flop DFF comprises a writing circuit 620, a non-volatile memory element 630, a reading circuit 640, a control circuit 660 and a logic memory circuit 670.

The control circuit 660 includes NOT gates 661, 663, 664, and 666, and NAND gates 662 and 665. The input terminal of the NOT gate 661 serves as the read terminal RD for receiving the read signal $S_{RD}$. The output terminal of the NOT gate 661 provides the inverting read signal $SB_{RD}$ to the logic memory circuit 670 and the reading circuit 640. The inverting read signal $SB_{RD}$ is reverse to the read signal $S_{RD}$. The first input terminal of the NAND gate 662 can serve as a clock terminal CLK for receiving an original clock signal. The second input terminal of the NAND gate 662 is coupled to the output terminal of the NOT gate 661, and receives the inverting read signal $SB_{RD}$. The output terminal of the NAND gate 662 can provide a clock signal CK1B to the logic memory circuit 670. The input terminal of the NOT gate 663 is coupled to the output terminal of the NAND gate 662 and receives the clock signal. The output terminal of the NOT gate 663 provides the clock signal CK1 to the logic memory circuit 670. The clock signal CK1 is inverse to the clock signal CK1B. The input terminal of the NOT gate 664 receives the original clock signal. The second input terminal of the NAND gate 665 is coupled to an output terminal of the NOT gate 664. The second input terminal of the NAND gate 665 is coupled to an output terminal of the NOT gate 661 and receives the inverting read signal $SB_{RD}$. The output terminal of the NAND gate 665 provides the clock signal CK0B to the logic memory circuit 670. The input terminal of the NOT gate 666 is coupled to the output terminal of the NAND gate 665 and receives the clock signal CK0B. The output terminal of the NOT gate 666 provides the clock signal CK0 to the logic memory circuit 670. The clock signal CK0 is inverse to the clock signal CK0B.

As shown in FIG. 6, the logic memory circuit 670 comprises a NAND gate 671, transmission gates 672, 674, 675, 676, 678, 680, and 681, NOT gates 673, 679 and 682, and a NOR gate 677. In this embodiment, each transmission gate has a P-channel gate and a N-channel gate. The P-channel gate of the transmission gate 681 is controlled by the clock signal CK0B, and the N-channel gate of the transmission gate 681 is controlled by the clock signal CK0. The first terminal of the transmission gate 681 serves as the input terminal D of the non-volatile D-Flip-Flop DFF. The second terminal of the transmission gate 681 is coupled to a second input terminal of the NAND gate 671. The first input terminal of the NAND gate 671 serves as a reset terminal RB of the non-volatile D-Flip-Flop DFF and configured to receive the reset signal $SB_{RT}$. The first terminal of the transmission gate 672 is coupled to the output terminal of the NAND gate 671. The P-channel gate of the transmission gate 672 is controlled by the read signal $S_{RD}$. The N-channel gate of the transmission gate 672 is controlled by the inverting read signal $SB_{RD}$. During a normal operation period and a writing period, the transmission gate 672 is turned on. During a reading period, the transmission gate 672 is turned off. The input terminal of the NOT gate 673 is coupled to the second terminal of the transmission gate 672. The first terminal of the transmission gate 674 is coupled to the output terminal of the NOT gate 673. The second terminal of the transmission gate 674 is coupled to the second input terminal of the NAND gate 671. The P-channel gate of the transmission gate 674 is controlled by the clock signal CK0. The N-channel gate of the transmission gate 674 is controlled by the clock signal CK0B.

The first terminal of the transmission gate 675 is coupled to the output terminal of the NAND gate 671. The N-channel gate of the transmission gate 675 is controlled by the clock signal CK1. The P-channel gate of the transmission gate 675 is controlled by the clock signal CK1B. The first terminal of the transmission gate 676 is coupled to the input terminal of the NOT gate 673. The N-channel gate of the transmission gate 676 is controlled by the read signal $S_{RD}$. The P-channel gate of the transmission gate 676 is controlled by the inverting read signal $SB_{RD}$. During the normal operation period and the writing period, the transmission gate 676 is turned off. During the reading period, the transmission gate 676 is turned on. The first input terminal of the NOR gate 677 receives the reset signal $S_{RT}$ from a front stage circuit, which can be a controller not shown in figure. The second input terminal of the NOR gate 677 is coupled to the second terminal of the transmission gate 675. The input terminal of the NOT gate 682 is coupled to the output terminal of the NOR gate 677. The output terminal of the NOT gate 682 serves as the inverting output terminal QB of the non-volatile D-Flip-Flop DFF. The first terminal of the transmission gate 678 is coupled to the output terminal of the NOR gate 677. The second terminal of the transmission gate 678 is coupled to the output terminal Q of the non-volatile D-Flip-Flop DFF. The P-channel gate of the transmission gate 678 is controlled by the read signal $S_{RD}$. The N-channel gate of the transmission gate 678 is controlled by the inverting read signal $SB_{RD}$. During the normal operation period and the writing period, the transmission gate 678 is turned on. During the reading period, the transmission gate 678 is turned off. The input terminal of the NOT gate 679 is coupled to the second terminal of the transmission gate 678. The first terminal of the transmission gate 680 is coupled to the output terminal of the NOT gate 679. The second terminal of the transmission gate 680 is coupled to the second input terminal of the NOR gate 677 and the second terminal of the transmission gate 676. The P-channel gate of the transmission gate 680 is controlled by the clock signal CK1. The N-channel gate of the transmission gate 680 is controlled by the clock signal CK1B.

As shown in FIG. 6, the writing circuit 620 can comprise voltage level convertors 621 and 622. The input terminal of the voltage level convertor 622 is coupled to the inverting output terminal QB of the non-volatile D-Flip-Flop DFF. The output terminal of the voltage level convertor 622 serve as a first output terminal of the writing circuit 620 and is coupled to the first terminal (such as the upper electrode TE) of the non-volatile memory element 630. The input terminal of the voltage level convertor 621 is coupled to the output terminal Q of the non-volatile D-Flip-Flop DFF. The output terminal of the voltage level convertor 621 serves as the second output terminal of the writing circuit 620 and is coupled to the second terminal (such as the lower electrode BE) of the non-volatile memory element 630.

The implementation of the writing circuit 620 of the present invention is not limited to above-mentioned example. In another embodiment, the writing circuit 620 comprises buffers 623 and 624. As shown in FIG. 6, the input terminal of the buffer 623 is coupled to the output terminal Q of the non-volatile D-Flip-Flop DFF. The output terminal of the buffer 623 serves as the second output terminal of the writing circuit 620 and is coupled to the second terminal (such as the lower electrode BE) of the non-volatile memory element 630. The input terminal of the buffer 624 is coupled to the inverting output terminal QB of the non-volatile D-Flip-Flop DFF. The output terminal of the buffer 624 serves as a first output terminal of the writing circuit 620 and is coupled to the first terminal (such as the upper electrode TE) of the non-volatile memory element 630.

As shown in FIG. 6, the reading circuit 640 comprise a transmission gate 641, a resistor 642, a switch 643 and a switch 644. A first terminal of the transmission gate 641 serves as the output terminal of the reading circuit 640 and is coupled to the output terminal Q of the logic memory circuit 670. A second terminal of the transmission gate 641 serves as the first input terminal of the reading circuit 640 and is coupled to the first terminal (such as the upper electrode TE) of the non-volatile memory element 630. A first terminal of the resistor 642 is coupled to the second terminal of the transmission gate 641. A first terminal of the switch 643 is coupled to the second terminal of the resistor 642. A second terminal of the switch 643 receives the system voltage VDD. A first terminal of the switch 644 serves as the second input terminal of the reading circuit 640 and is coupled to the second terminal (such as the lower electrode BE) of the non-volatile memory element 630. The second terminal of the switch 644 receives a reference voltage, such as a ground voltage GND.

Furthermore, before a storing process (that is, before a writing period), the output terminal Q of the non-volatile D-Flip-Flop DFF is at a high voltage level, such as logic "1", and the inverting output terminal QB of the non-volatile D-Flip-Flop DFF is at logic "0". Before the system enters the standby mode or is powered off, the non-volatile D-Flip-Flop DFF performs a storing process, which is a writing operation, so as to record the information or data of the logic memory circuit 670 in the non-volatile memory element 630. During the writing period, the write signal $S_{WR}$ is pulled up to the high voltage level, such as logic "1", so that the buffer 623 can convert the signal (logic "1") of the output terminal Q into a high write-voltage, such as forming voltage VFW. The buffer 624 can convert the signal (logic "0") of the inverting output terminal QB into a low write-voltage, such as ground voltage GND. At this time, the current provided by the buffer 623 flows from the lower electrode BE of the non-volatile memory element 630 to the upper electrode TE of the non-volatile memory element 630, so that the resistance state of the non-volatile memory element 630 is reset as the high resistance state.

After the storing process, such as in writing period, is completed, the non-volatile D-Flip-Flop DFF enters a power-off period. During the power-off period, the system stops providing power to the logic memory circuit 670, the writing circuit 620 and the reading circuit 640, so as to reduce power consumption. In this case, the non-volatile D-Flip-Flop DFF enters the standby mode or power-off mode.

After the power-off period is ended, the system provides power to the logic memory circuit 670, the writing circuit 620 and the reading circuit 640 again. After the power-off period is ended, the non-volatile D-Flip-Flop DFF can perform a restoring procedure to enter the reading period, so that the data stored in the non-volatile memory element 630 can be written back to the logic memory circuit 670. During the restoring procedure, the read signal $S_{RD}$ is pulled up to the high voltage level, such as logic "1", so that the transmission gate 641, and the switches 643 and 644 are turned on. Since the non-volatile memory element 630 is at the high resistance state which is equivalent to logic "1", the voltage of the output terminal Q of the logic memory circuit 670 is pulled up, and the inverting output terminal QB of the logic memory circuit 670 can output the signal with the low voltage level equivalent to logic "0". After the reading period is ended, the signal of the output terminal Q of the logic memory circuit 670 can be back to logic "1', and the signal of the inverting output terminal QB is back to logic "0". With above configuration, the non-volatile D-Flip-Flop DFF can provide above-mentioned function.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A biasing circuit adapted to provide power to a microphone which generates an analog signal according to environmental sound, and the biasing circuit comprising:

a first impedance element having a first impedance and coupled between a first terminal of the microphone and a first power node;

a second impedance element having a second impedance and coupled between a second terminal of the microphone and a second power node;

a detection circuit coupled between the first terminal and the second terminal, and configured to generate a detection signal according to the analog signal; and a control circuit configured to adjust the first impedance and the second impedance according to the detection signal;

wherein responsive to the control circuit being operated in a standby mode, the control circuit increases the first impedance and the second impedance, and responsive to the control circuit being operated in a normal mode, the control circuit decreases the first impedance and the second impedance.

2. The biasing circuit as claimed in claim 1, wherein the first impedance element and the second impedance element are a first resistive random-access memory cell and a second resistive random-access memory cell.

3. The biasing circuit as claimed in claim 2, wherein responsive to the control circuit being operated in the normal mode, the control circuit sets each of the first resistive random-access memory cell and the second resistive random-access memory cell as a low resistance state, and responsive to the control circuit being operated in the standby mode, the control circuit sets each of the first resistive random-access memory cell and the second resistive random-access memory cell as a high resistance state.

4. The biasing circuit as claimed in claim 1, wherein the detection circuit compares the analog signal with a preset voltage level, to generate the detection signal, and the control circuit is operated in one of the normal mode and the standby mode according to the detection signal.

5. The biasing circuit as claimed in claim 4, wherein responsive to a number of times of the analog signal being higher than the preset voltage level reaching a target value, the control circuit is operated in the normal mode, and responsive to the number of times of the analog signal being higher than the preset voltage level not reaching the target value, the control circuit is operated in the standby mode.

6. The biasing circuit as claimed in claim 5, wherein the detection circuit comprises a counter configured to count the number of times of the analog signal being higher than the preset voltage level.

7. The biasing circuit as claimed in claim 1, further comprising:

a power supplier coupled to the first power node and configured to provide an output current, wherein responsive to the control circuit being operated in the normal mode, the control circuit controls the power supplier to increase the output current, and responsive to the control circuit being operated in the standby mode, the control circuit controls the power supplier to decrease the output current.

8. The biasing circuit as claimed in claim 7, wherein the power supplier is a low-power LDO.

9. The biasing circuit as claimed in claim 7, wherein the output current is higher than 100 uA in the normal mode, and the output current is lower than 100 uA in the standby mode.

* * * * *